(12) United States Patent
Yokoi et al.

(10) Patent No.: US 8,354,215 B2
(45) Date of Patent: Jan. 15, 2013

(54) METHOD FOR STRIPPING PHOTORESIST

(75) Inventors: Shigeru Yokoi, Kanagawa (JP);
Kazumasa Wakiya, Kanagawa (JP);
Takayuki Haraguchi, Kanagawa (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 12/883,592

(22) Filed: Sep. 16, 2010

(65) Prior Publication Data

US 2011/0000874 A1 Jan. 6, 2011

Related U.S. Application Data

(63) Continuation of application No. 12/458,992, filed on Jul. 29, 2009, now abandoned, which is a continuation of application No. 12/219,120, filed on Jul. 16, 2008, now abandoned, which is a continuation of application No. 11/889,394, filed on Aug. 13, 2007, now abandoned, which is a continuation of application No. 10/512,586, filed as application No. PCT/JP03/05336 on Apr. 25, 2003, now abandoned.

(30) Foreign Application Priority Data

Apr. 26, 2002 (JP) ................................. 2002-125471
Oct. 23, 2002 (JP) ................................. 2002-308993

(51) Int. Cl.
*G03F 7/42* (2006.01)
*B08B 7/04* (2006.01)

(52) U.S. Cl. ........ 430/256; 430/313; 430/323; 430/329; 134/1.3

(58) Field of Classification Search .................. 430/256, 430/270.1, 277.1, 313, 329, 323; 510/176; 134/1.3

See application file for complete search history.

(56) References Cited

U.S. PATENT DOCUMENTS

| | | | | |
|---|---|---|---|---|
| 5,759,973 A | * | 6/1998 | Honda et al. | 510/176 |
| 6,225,030 B1 | * | 5/2001 | Tanabe et al. | 430/313 |
| 6,391,472 B1 | * | 5/2002 | Lamb et al. | 428/624 |
| 6,413,923 B2 | | 7/2002 | Honda et al. | 510/175 |
| 6,417,112 B1 | | 7/2002 | Peyne et al. | 438/754 |
| 7,157,415 B2 | | 1/2007 | Peyne et al. | 510/255 |

FOREIGN PATENT DOCUMENTS

| | | |
|---|---|---|
| GB | 2354086 | 3/2001 |
| JP | 11-74180 | 3/1999 |
| JP | 11-087502 | 3/1999 |
| JP | 11-233405 | 8/1999 |
| JP | 2000-091269 | 3/2000 |
| JP | 2001-083712 | 3/2001 |
| JP | 2001-85521 | 3/2001 |
| JP | 2001-203200 | 7/2001 |
| JP | 2001-209191 | 8/2001 |
| JP | 2001-223206 | 8/2001 |
| JP | 2001-290287 | 10/2001 |
| JP | 2001-338978 | 12/2001 |
| JP | 2002-110788 | 4/2002 |
| JP | 2002-231696 | 8/2002 |
| JP | 2003-140364 | 5/2003 |
| WO | 01/82002 | 11/2001 |
| WO | 02/03454 | 1/2002 |
| WO | 02/33033 | 4/2002 |

OTHER PUBLICATIONS

International Search Report mailed Jul. 22, 2003 in International (PCT) Application No. PCT/JP03/05336, with English translation.

* cited by examiner

*Primary Examiner* — Anca Eoff
(74) *Attorney, Agent, or Firm* — Wenderoth, Lind & Ponack, L.L.P.

(57) ABSTRACT

Disclosed is a method for stripping a photoresist comprising: (I) providing a photoresist pattern on a substrate where the substrate has at least a copper (Cu) wiring and a low-dielectric layer thereon, and selectively etching the low-dielectric layer by using the photoresist pattern as a mask; (II) contacting the substrate after the step (I), with ozone water and/or aqueous hydrogen peroxide; and (III) contacting the substrate after the step (II), with a photoresist stripping solution that contains at least a quaternary ammonium hydroxide. The present invention provides a method for stripping a photoresist that enables to strip effectively photoresist films and etching residues after etching step even in a process not including an $O_2$ plasma ashing treatment in micropatterning of a substrate having at least Cu wiring and a low-dielectric layer thereon, as in a dual damascene forming process, and, in addition, the method of the invention does not have any negative influence on the dielectric constant of the low-dielectric layer, and ensures an excellent anti-corrosivity.

5 Claims, No Drawings

METHOD FOR STRIPPING PHOTORESIST

This application is a Continuation of U.S. application Ser. No. 12/458,992, filed Jul. 29, 2009, now abandoned, which is a Continuation of U.S. application Ser. No. 12/219,120, filed Jul. 16, 2008, now abandoned, which is a Continuation of U.S. application Ser. No. 11/889,394, filed Aug. 13, 2007, now abandoned, which is a Continuation of U.S. application Ser. No. 10/512,586, filed Dec. 27, 2004, now abandoned, which is the National stage of PCT/JP03/05336, filed Apr. 25, 2003.

TECHNICAL FIELD

The present invention relates to a method for stripping a photoresist formed on a substrate having at least a copper (Cu) wiring and a low-dielectric layer thereon. In particular, the invention is favorably applied to a method for stripping a photoresist in a process not including a conventional $O_2$ plasma ashing step in the fabrication of semiconductor devices, such as ICs and LSIs.

BACKGROUND ART

Semiconductor devices, such as IC and LSIs, are produced in the following process. A photoresist is uniformly coated on an electroconductive metallic layer, an insulating layer and a low-dielectric material layer formed on a substrate, such as a silicon wafer, by CVD vapor deposition process or the like. The photoresist is selectively subjected to exposure and development to form a photoresist pattern. The electroconductive metallic layer, the insulating layer and the low-dielectric material layer formed by CVD vapor deposition are selectively etched by using the photoresist pattern as a mask to form a minute circuit, and the photoresist layer thus becoming unnecessary is then removed with a stripping solution.

It is a trend in recent years that wiring circuits are becoming minute and multilayered as integration degree of semiconductor devices increases and chip size reduces, in which there arise problems in semiconductor devices, i.e., resistance of metallic layers (wiring resistance) and wiring delay caused by wiring capacities. Accordingly, there are proposals of using metals, such as copper (Cu), having resistance smaller than that of aluminum (Al) having been mainly employed as a wiring material, and in recent years, two kinds of devices are being used, i.e., devices using an Al wiring (a metallic wiring using Al as a major component, such as Al and an Al alloy) and devices using a copper wiring (a metallic wiring using Cu as a major component).

Upon forming a Cu metallic wiring, in particular, a process is used in which a Cu multilayer wiring is formed without etching Cu by using a dual damascene process, owing to the low etching resistance of Cu. Various kinds of dual damascene processes have been proposed. One example thereof comprises forming a Cu layer, a low-dielectric layer (e.g., SiOC layer) is accumulated as being multilayered on a substrate, then providing a photoresist layer as the uppermost layer, and thereafter selectively exposing the photoresist layer to light and developing it to form a photoresist pattern (a "first photoresist pattern"). Then, by serving the first photoresist pattern as a mask pattern, the low-dielectric layer is etched, and then the first photoresist pattern is stripped away by $O_2$ plasma ashing treatment or the like thereby to form via holes that connect to the Cu layer on the substrate. Next, another photoresist pattern (a "second photoresist pattern") is newly formed as the uppermost layer on the remaining multilayer structure, and the remaining low-dielectric layer is partly etched by using the second photoresist pattern as a mask pattern to thereby form wiring trenches that communicate with the above-described via holes. With that, the second photoresist pattern is stripped away by $O_2$ plasma ashing treatment or the like, and then the via holes and the trenches are filled with Cu by electrolytic plating or other method, thereby forming multilayered Cu wiring conductors.

The substrate for use in the process may optionally be provided with a barrier layer (e.g., SiN layer, SiC layer) as an etching stopper layer between the Cu layer and the low dielectric layer. In such a case, via holes and trenches are formed, and then, while the barrier layer exposed out on the substrate is kept as such or after the barrier layer has been removed, the photoresist is stripped away and thereafter the via holes and the trenches are filled with Cu.

In the dual damascene process as above, Si deposition may readily occur, resulting from the low-dielectric layer, during the etching treatment and the plasma ashing treatment for forming the via holes and the trenches, and this may form Si deposits around the opening of the trenches. In addition, a deposition that results from photoresist may also occur. If these deposits are not completely removed, then it causes a problem in that the yield in semiconductor production may lower.

Accordingly, heretofore, $O_2$ plasma ashing treatment has been employed for removal of photoresist patterns and etching residues in conventional patterning for metal wiring. However, with the development of ultra-micropatterning technology, a material having a lower dielectric constant has become used for the low-dielectric layer to be formed on Cu wiring substrates, and at present, a process of using a low-dielectric layer that has a dielectric constant of 3 or less is being developed. It is said that the material of the type having such a low dielectric constant (low-k material) is poorly resistant to ashing or is not resistant to ashing, and when such a low-k material is used, a process not including an $O_2$ plasma ashing step after etching must be employed.

Accordingly, in the art of photolithography for producing advanced micropatterned multilayer semiconductor devices, it is a pressing need to develop a method for stripping a photoresist that exhibits excellent photoresist strippability and etching residue strippability even in a process not including a conventional $O_2$ plasma ashing treatment to the same level as or to a higher level than that in the conventional process of including an $O_2$ plasma ashing step.

In a dual damascene process of using Cu wiring, when a photoresist and an etching residue are stripped away from a substrate having a barrier layer (etching stopper layer) on a Cu layer thereon while the barrier layer is kept remaining on the Cu layer, then the Cu layer may be kept away from direct contact with the photoresist stripping solution during the stripping treatment, and therefore, it is desirable that the stripping treatment is more efficiently attained according to it.

JP-A-11-774180 (Patent Reference 1) discloses a technique of washing a semiconductor substrate having Al or the like metal wiring thereon, with a washing solution containing an oxidizing agent (hydrogen peroxide) before a photoresist is stripped away from it, and then stripping the photoresist from it by the use of a stripping solution. Regarding the stripping solution, Reference 1 discloses, in one line (as example listing) in its [0007], a tetramethylammonium hydroxide (TMAH)-based stripping solution such as that in JP-A-63-147168 (Patent Reference 2), along with an alkanolamine-based stripping solution and a fluorine-containing stripping solution also disclosed therein. However, in Patent Reference 1, only monoethanolamine-based stripping solutions are actually tested and confirmed in point of their effects, and Patent References 1 and 2 do neither describe nor suggest at all a photoresist stripping method suitable to a dual damascene process that is targeted by the present invention.

JP-A-11-233405 (Patent Reference 3) discloses a method for producing semiconductor devices, which comprises dry etching a semiconductor substrate having an Al or the like metal wiring thereon, then washing a photoresist pattern with a washing solution that comprises an oxidizing agent and an organic acid, and thereafter stripping it with a resist stripping solution. Also in this publication, only monoethanolamine-based stripping solutions are actually tested and confirmed in point of their effects, and this publication does neither describe nor suggest at all the photoresist stripping method suitable to a dual damascene process that is targeted by the present invention.

Patent Reference 1: JP-A-11-74180
Patent Reference 2: JP-A-63-147168
Patent Reference 3: JP-A-11-233405

DISCLOSURE OF INVENTION

The present invention has been made in consideration of the above-mentioned situation, and its object is to provide a method for stripping a photoresist which, even when employed in a process with no $O_2$ plasma ashing treatment for micropatterning a substrate that has at least copper (Cu) wiring and a low-dielectric layer thereon, enables effective stripping of an etched photoresist film and an etching residue and which exhibits good corrosion resistance not having any negative influence on the dielectric constant of the low dielectric layer.

To solve the above-mentioned problem, the invention provides a method for stripping a photoresist that comprises:

(I) selectively etching a low-dielectric layer provided on a substrate, where the substrate has at least a copper (Cu) wiring and the low-dielectric layer thereon, by using a photoresist pattern as a mask which is formed on the substrate;

(II) contacting the substrate after the step (I), with ozone water and/or aqueous hydrogen peroxide; and (III) contacting the substrate after the step (II), with a photoresist stripping solution that contains at least a quaternary ammonium hydroxide.

BEST MODE FOR CARRYING OUT THE INVENTION

The invention is described in detail hereinunder.
Step (I):

Any known photolithography may be applied to the step. For example, a copper (Cu) wiring is formed on a substrate such as silicon wafer, and a low-dielectric layer is formed thereon. If desired, a barrier layer (etching stopper layer) may be provided on the Cu wiring as an interlayer, and an insulating layer may be provided to form a multi-layered structure.

In the invention, the copper (Cu) wiring includes both wiring of pure copper, and a wiring of a copper-based alloy (e.g., Al—Si—Cu, Al—Cu). In the invention, an Al-based wiring or any other metal wirings than the Cu wiring may also be used. Not specifically defined, the metal layer may be formed through CVD, electrolytic plating or the like.

The barrier layer (etching stopper layer) includes SiN layer, SiC layer, Ta layer, TaN layer, but is not limited to these.

Most preferably, the low-dielectric layer in the invention is formed of a material having a dielectric constant of 3 or less. The dielectric constant as meant herein is the proportional constant ($\in$) in a relational equation of D=$\in$E where D indicates a magnetic flux density and E indicates a magnetic field intensity.

Examples of the material for the low dielectric layer include a low dielectric material (low-k material), for example, a carbon-doped silicon oxide (SiOC) material, such as "Black Diamond" (produced by Applied Materials, Inc.), "Coral" (produced by Novellus Systems, Inc.) and "Aurora" (produced by ASM Japan Co., Ltd.); an MSQ (methylsilsesquioxane) material, such as "OCD T-7", "OCD T-9", "OCD T-11", "OCD T-31" and "OCD T-39" (all produced by Tokyo Ohka Kogyo Co., Ltd.); and an HSQ (hydroxysilsesquioxane) material, such as "OCD T-12" and "OCD T-32" (all produced by Tokyo Ohka Kogyo Co., Ltd.), but it is not limited to these examples.

The low-dielectric layer may be formed by applying the above-mentioned low-dielectric material (low-k material) on a substrate, and then baking it at a high temperature generally not lower than 350° C. for crystallizing it.

Next, a photoresist composition is applied on the low-dielectric layer and dried, and then exposed to light and developed according to known photolithography to form a photoresist pattern.

The photoresist composition is preferably any of those generally used for KrF-, ArF-, $F_2$-excimer lasers or electron rays, but not limited thereto.

The condition for exposure and development may be suitably determined, depending on the photoresist selected in accordance with the object. For exposure, for example, the photoresist layer may be exposed to a light source capable of emitting active rays such as UV rays, far-UV rays, excimer laser, X-rays or electron rays, such as a low-pressure mercury lamp, a high-pressure mercury lamp, an ultra-high-pressure mercury lamp or a xenon lamp, through a desired mask pattern, or the photoresist layer may be directly patterned by controlling electron rays applied thereto. Next, if desired, the photoresist pattern may be further baked (post-exposure baking).

The method of development is not also specifically defined. For example, the photoresist-coated substrate is dipped in a developer for a predetermined period of time, then washed with water and dried (dip development); or a developer is dropwise applied to the surface of the photoresist-coated substrate, and then the substrate is kept as such for a predetermined period of time, then washed with water and dried (paddle development); or the photoresist surface is sprayed with a developer, then washed with water and dried (spray development). Various modes of development may be employed in accordance with the object.

Next, the low-dielectric layer is selectively etched, for example, dry-etched through the formed photoresist pattern serving as a mask, to thereby form via holes or trenches (for wiring). In the invention, a dual damascene process is preferably employed.
Step (II):

After the etching step as above, the substrate is contacted with ozone water and/or aqueous hydrogen peroxide. This step (II) is for decomposing the photoresist pattern and the etching residue prior to the subsequent step (III).

Ozone water for use herein is preferably one prepared by dissolving ozone gas in pure water by bubbling or the like. Preferably, the ozone concentration is from 1 ppm to a saturation concentration. Aqueous hydrogen peroxide for use herein is preferably an aqueous solution having a hydrogen peroxide concentration of from 0.1 to 60% by mass or so, more preferably from 0.5 to 35% by mass or so.

For their contact, employable are a dip method, a paddle method and a shower method like those for the development as above. Preferably, the substrate is dipped in ozone water and/or aqueous hydrogen peroxide for 5 to 60 minutes or so.

Step (III):

After the step (II), the substrate is contacted with a photoresist stripping solution that contains at least a quaternary ammonium hydroxide to thereby remove the photoresist pattern and the etching residue.

The quaternary ammonium hydroxide is preferably one represented by the following general formula (I):

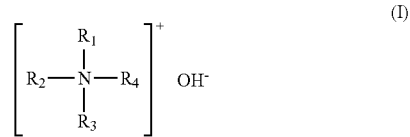

(I)

wherein $R_1$, $R_2$, $R_3$ and $R_4$ each independently represent an alkyl or hydroxyalkyl group having from 1 to 4 carbon atoms.

Concretely, it includes tetramethylammonium hydroxide (=TMAH), tetraethylammonium hydroxide, tetrapropylammonium hydroxide, tetrabutylammonium hydroxide, methyltripropylammonium hydroxide, methyltributylammonium hydroxide, trimethylethylammonium hydroxide, (2-hydroxyethyl)trimethylammonium hydroxide (=choline), (2-hydroxyethyl)triethylammonium hydroxide, (2-hydroxyethyl)tripropylammonium hydroxide, (1-hydroxypropyl)trimethylammonium hydroxide. Of those, preferred are tetramethylammonium hydroxide, tetrabutylammonium hydroxide, tetrapropylammonium hydroxide, methyltributylammonium hydroxide, methyltripropylammonium hydroxide and choline, in view of their ability to strip Cu or Si-containing residues and to strip photoresist. One or more such quaternary ammonium hydroxides may be used herein.

The amount of the quaternary ammonium hydroxide to be in the photoresist stripping solution is preferably from 1 to by mass or so, more preferably from 2 to 10% by mass or so.

The photoresist stripping solution for use in the invention generally contains water and a water-soluble organic solvent, in addition to the quaternary ammonium hydroxide therein. The amount of water may be from 5 to 60% by mass or so, preferably from 10 to 50% by mass. The balance is a water-soluble organic solvent.

The water-soluble organic solvent includes sulfoxides such as dimethyl sulfoxide; sulfones, such as dimethyl sulfone, diethyl sulfone, bis(2-hydroxyethyl) sulfone, tetramethylene sulfone (=sulforane); amides, such as N,N-dimethylformamide, N-methylformamide, N,N-dimethylacetamide, N-methylacetamide, N,N-diethylacetamide; lactams, such as N-methyl-2-pyrrolidone, N-ethyl-2-pyrrolidone, N-propyl-2-pyrrolidone, N-hydroxymethyl-2-pyrrolidone, N-hydroxyethyl-2-pyrrolidone; imidazolidinones, such as 1,3-dimethyl-2-imidazolidinone, 1,3-diethyl-2-imidazolidinone, 1,3-diisopropyl-2-imidazolidinone; polyalcohols and their derivatives, such as ethylene glycol, ethylene glycol monomethyl ether, ethylene glycol monoethyl ether, ethylene glycol monobutyl ether, ethylene glycol monomethyl ether acetate, ethylene glycol monoethyl ether acetate, diethylene glycol, diethylene glycol monomethyl ether, diethylene glycol monoethyl ether, diethylene glycol monobutyl ether, propylene glycol monomethyl ether, propylene glycol monoethyl ether, propylene glycol monopropyl ether, propylene glycol monobutyl ether. Of those, preferred are dimethyl sulfoxide, dimethylimidazolidinone, N-methyl-2-pyrrolidone, diethylene glycol monobutyl ether, sulforane, N,N-dimethylacetamide, and N,N-dimethylformamide. One or more such water-soluble organic solvents may be sued herein.

The photoresist stripping solution may further contain a water-soluble amine, if desired. The water-soluble amine includes alkanolamines, such as monoethanolamine, diethanolamine, triethanolamine, 2-(2-aminoethoxy)ethanol, N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine; polyalkylene-polyamines, such as diethylenetriamine, triethylenetetramine, propylenediamine, N,N-diethylethylenediamine, 1,4-butanediamine, N-ethylethylenediamine, 1,2-propanediamine, 1,3-propanediamine, 1,6-hexanediamine; aliphatic amines, such as 2-ethylhexylamine, dioctylamine, tributylamine, tripropylamine, triallylamine, heptylamine, cyclohexylamine; aromatic amines, such as benzylamine, diphenylamine; cyclic amines, such as piperazine, N-methylpiperazine, methylpiperazine, hydroxyethylpiperazine. Of those, preferred are monoethanolamine; 2-(2-aminoethoxy)ethanol and N-methylethanolamine, in view of their ability to remove photoresist and etching residues and of their ability to prevent metal wirings from corrosion. When such a water-soluble amine is added to the photoresist stripping solution, then its amount is preferably from 10 to 50% by mass or so.

In addition, the solution may further contain a carboxyl group-having acid compound, and a salt of hydrofluoric acid with a metal ion-free base, especially in view of their stripping abilities.

Preferred examples of the carboxyl group-having acid compound are acetic acid, propionic acid, and glycolic acid. When such a carboxyl group-having acid compound is added to the photoresist stripping solution, then its amount is preferably from 2 to 20% by mass or so.

One preferred example of the salt of hydrofluoric acid with a metal ion-free base is ammonium fluoride. When such a salt of hydrofluoric acid with a metal ion-free base is added to the photoresist stripping solution, then its amount is preferably from 0.1 to 10% by mass or so.

Further if desired, especially when the substrate is not provided with a barrier layer (etching stopper layer) as an interlayer, or when the substrate is provided with such a barrier layer but is processed for stripping photoresist from it after the barrier layer is etched away, then it is desirable that at least one corrosion inhibitor selected from aromatic hydroxy compounds, benzotriazole-based compounds and mercapto group containing compounds is added to the photoresist stripping solution, for preventing Cu wirings from the corrosion.

Examples of the aromatic hydroxy compounds include concretely phenol, cresol, xylenol, pyrocatechol (=1,2-dihydroxybenzene), tert-butylcatechol, resorcinol, hydroquinone, pyrogallol, 1,2,4-benzenetriol, salicyl alcohol, p-hydroxybenzyl alcohol, o-hydroxybenzyl alcohol, p-hydroxyphenethyl alcohol, p-aminophenol, m-aminophenol, diaminophenol, a minoresorcinol, p-hydroxybenzoic acid, o-hydroxybenzoic acid, 2,4-dihydroxybenzoic acid, 2,5-dihydroxybenzoic acid, 3,4-dihydroxybenzoic acid, 3,5-dihydroxybenzoic acid, gallic acid and the like. Of those, preferred are pyrocatechol, pyrogallol and gallic acid. One or more such aromatic hydroxy compounds may be used herein.

The benzotriazole-based compounds include the ones represented by the following general formula (II):

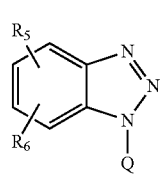

(II)

where $R_5$ and $R_6$ are each independently a hydrogen atom, a substituted or unsubstituted hydrocarbon group of 1-10 carbon atoms, a carboxyl group, an amino group, a hydroxyl group, a cyano group, a formyl group, a sulfonylalkyl group or a sulfo group; Q is a hydrogen atom, a hydroxyl group or a substituted or unsubstituted hydrocarbon group of 1-10 carbon atoms provided that said hydrocarbon group may have an amide bond or ester bond in the structure, an aryl group or the group represented by the following formula (III):

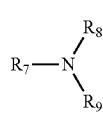

(III)

wherein $R_7$ represents an alkyl group of 1-6 carbon atoms; and $R_8$ and $R_9$ are each independently a hydrogen atom, a hydroxyl group or a hydroxyalkyl group or an alkoxyalkyl group of 1-6 carbon atoms.

In the definition of the groups Q, $R_5$ and $R_6$ as specified in the present invention, each of the hydrocarbon groups may be an aromatic hydrocarbon group or an aliphatic hydrocarbon group, may be saturated or unsaturated, and may be a linear group or a branched group. Examples of a substituted hydrocarbon group include hydroxyalkyl groups and alkoxylalkyl groups.

In the case where pure Cu is used as the metal conductor on the substrate, it is particularly preferable that Q in the above general formula (II) is a group represented by the formula (III). And in the formula (III), it is preferred that $R_8$ and $R_9$ are independently a hydroxyalkyl group or an alkoxyalkyl group of 1-6 carbon atoms.

In the general formula (II), Q preferably forms a water-soluble group and to give specific examples, a hydrogen atom, an alkyl group of 1-3 carbon atoms (i.e., methyl, ethyl, propyl or isopropyl), a hydroxyalkyl group of 1-3 carbon atoms and a hydroxyl group are particularly preferred from the viewpoint of effective protection of inorganic material layer, such as a polysilicon film, an amorphous silicon film, etc. against corrosion.

Specific examples of the benzotriazole-based compounds include benzotriazole, 5,6-dimethylbenzotriazole, 1-hydroxybenzotriazole, 1-methylbenzotriazole, 1-aminobenzotriazole, 1-phenylbenzotriazole, 1-hydroxymethylbenzotriazole, 1-benzotriazole-methyl carboxylate, 5-benzotriazole-carboxylic acid, 1-methoxybenzotriazole, 1-(2,2-dihydroxyethyl)benzotriazole, 1-(2,3-dihydroxypropyl)benzotriazole, and products of "IRGAMET" series marketed from Ciba Specialty Chemicals, such as 2,2'{[(4-methyl-1H-benzotriazol-1-yl)methyl]imino}bisethanol, 2,2'-{[(5-methyl-1H-benzotriazol-1-yl)methyl]imino}bisethanol, 2,2'-{[(4-methyl-1H-benzotriazol-1-yl)methyl]imino}bisethane and 2,2'-{[(4-methyl-1H-benzotriazol-1-yl)methyl]imino}bispropane. Among these compounds, it is particularly preferable to use 1-(2,3-dihydroxypropyl)benzotriazole, 2,2'-{[(4-methyl-1H-benzotriazol-1-yl)methyl]imino}bisethanol, 2,2'-{[(5-methyl-1H-benzotriazol-1-yl)methyl]imino}bisethanol, etc. The benzotriazole-based compounds may be used either individually or in combination.

The mercapto group containing compound is preferably of such a structure that a hydroxyl group and/or a carboxyl group is present in either α-position or β-position on the carbon atom binding to the mercapto group. Specifically, preferred examples of such compound include 1-thioglycerol, 3-(2-aminophenylthio)-2-hydroxypropylmercaptan, 3-(2-hydroxyethylthio)-2-hydroxypropylmercaptan, 2-mercaptopropionic acid and 3-mercaptopropionic acid. Among these, 1-thioglycerol is used with particular preference. Mercapto group containing compounds may be used either singly or in admixture.

When the photoresist stripping solution contains any of such aromatic hydroxy compounds, benzotriazole-based compounds and mercapto group containing compounds, the amount of the compounds to be in the solution may vary depending on the type of the solution. When the compounds of those groups are combined and used in the solution, then the amount of each compound is preferably from 0.1 to 10% by mass or so, more preferably from 0.5 to 5% by mass or so. The uppermost limit of the total amount of the compounds is preferably at most 15% by mass or so.

In order to improve penetrating properties, the stripping solution of the invention may further contain, as an optional component, an acetylene alcohol/alkylene oxide adduct prepared by adding an alkylene oxide to an acetylene alcohol.

As the acetylene alcohol as described above, use may be preferably made of compounds represented by the following general formula (IV):

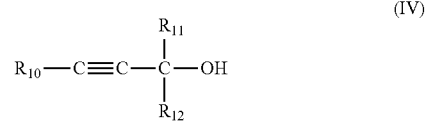

(IV)

wherein $R_{10}$ is a hydrogen atom or a group represented by the following formula (V):

(V)

and $R_{11}$, $R_{12}$, $R_{13}$ and $R_{14}$ are each independently a hydrogen atom or an alkyl group having 1-6 carbon atoms.

These acetylene alcohols are commercially available under trade names of "Surfynol" and "Olfin" series (both are produced by Air Product and Chemicals Inc.). Of these commercial products, "Surfynol 104", "Surfynol 82" or mixtures thereof are most preferred for the physical properties. Use can be also made of "Olfin B", "Olfin P", "Olfin Y" etc.

As the alkylene oxide to be added to the acetylene alcohol as described above, it is preferable to use ethylene oxide, propylene oxide or a mixture thereof.

In the present invention, it is preferable to use, as the acetylene alcohol/alkylene oxide adduct, compounds represented by the following general formula (VI):

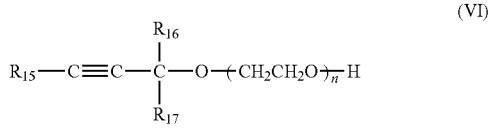

(VI)

wherein $R_{15}$ is a hydrogen atom or a group represented by the following formula (VII):

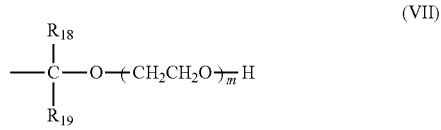

(VII)

and $R_{16}$, $R_{17}$, $R_{18}$ and $R_{19}$ are each independently a hydrogen atom or an alkyl group having 1-6 carbon atoms; (n+m) is an integer of 1 to 30, which is the number of ethylene oxide molecules added. This number subtly affects the properties of the compound such as water solubility and surface tension.

The acetylene alcohol/alkylene oxide adducts per se are known as surfactants. These products are commercially available under the trade names of "Surfynol" series (products of Air Product and Chemicals Inc.) and "Acetylenol" series (products of Kawaken Fine Chemicals Co., Ltd.) and have been appropriately utilized. Among these products, it is preferred to use "Surfynol 440" (n+m=3.5), "Surfynol 465" (n+m=10), "Surfynol 485" (n+m=30), "Acetylenol EL" (n+m=4), "Acetylenol EH" (n+m=10) or mixtures thereof, in view of the changes in their physical properties such as water solubility and surface tension depending on the number of ethylene oxide molecules added. A mixture of "Acetylenol EL" with "Acetylenol EH" in a mass ratio of 2:8 to 4:6 is particularly desirable.

Use of the acetylene alcohol/alkylene oxide adduct makes it possible to improve the penetrating properties and wetting properties of the stripping solution.

When the stripping solution according to the invention contains the acetylene alcohol/alkylene oxide adduct, the amount thereof is preferably 0.05-5% by mass, more preferably 0.1-2% by mass.

The photoresist stripping solution of the invention can advantageously be used with all photoresists, whether negative- or positive-working, that can be developed with aqueous alkaline solutions. Such photoresists include, but are not limited to, (i) a positive-working photoresist containing a naphthoquinonediazide compound and a novolak resin, (ii) a positive-working photoresist containing a compound that generates an acid upon exposure, a compound that decomposes with an acid to have a higher solubility in aqueous alkali solutions, and an alkali-soluble resin, (iii) a positive-working photoresist containing a compound that generates an acid upon exposure and an alkali-soluble resin having a group that decomposes with an acid to have a higher solubility in aqueous alkali solutions, and (iv) a negative-working photoresist containing a compound that generates an acid upon illumination with light, a crosslinker and an alkali-soluble resin.

In the step (III), the photoresist stripping solution is contacted with the substrate after the step (II), to thereby strip and remove the etching residues and the photoresist pattern. The method for their contact is not specifically defined, for which, in general, employed is any of a dip method, a paddle method or a spray method. Not specifically defined, the stripping time may be enough so far as the intended stripping may be attained within the period of time. In the invention, the decomposition treatment with ozone water and/or aqueous hydrogen peroxide is carried out prior to the removing step with the stripping solution, and then the stripping treatment is effected by the use of the photoresist stripping solution that contains at least the quaternary ammonium hydroxide mentioned above. Accordingly, even though the method of the invention does not include $O_2$ plasma ashing treatment, it ensures removal of etching residues and photoresist pattern to a level of advantageous stripping effect that is comparable to or higher than the $O_2$ plasma-ashing treatment, and, in addition, the low-dielectric layers can be protected from corrosion. Accordingly, even when a low-dielectric layer (low-k layer), which is said to have almost no resistance to ashing, is formed on a substrate, the substrate may well be treated according to the method of the invention for stripping photoresist therefrom. Any negative influences, such as changing a dielectric constant of the low-dielectric, corroding the layer, etc., are not occurred.

After the stripping step, the substrate may be rinsed with any conventional organic solvent, water or the like and may be dried. The organic solvent is preferably a lower alcohol, more preferably isopropyl alcohol.

For the dual damascene process favorably applicable to the invention, any known method is employable. For example, herein employable are a "via-first" method where via holes are first formed and then trenches are formed; and a "trench-first" method where trenches are first formed and then via holes are formed, which, however, are not limitative.

In the "via-first method", a low-dielectric layer is etched using a photoresist pattern (first photoresist pattern) serving as a mask to thereby form via holes that connect to the metal layer on a substrate (when the substrate is provided with a barrier layer formed thereon, then the via holes connect to the metal layer through the barrier layer), and then the substrate is contacted with the photoresist stripping solution that is used in the invention to thereby strip away the first photoresist pattern. Next, another photoresist pattern (second photoresist pattern) is formed on the remaining low-dielectric layer, and the layer is partly etched using the photoresist pattern serving as a mask to thereby form trenches that communicate with the via holes. After this (in case where the substrate has a barrier layer formed thereon, before the barrier layer exposed out of the substrate is etched away or after the barrier has been removed), the substrate is contacted with the photoresist stripping solution that is used in the invention to thereby strip away the second photoresist pattern.

On the other hand, in the "trench-first method", a low-dielectric layer is etched to a predetermined depth thereof using a photoresist pattern (first photoresist pattern) serving as a mask to thereby form trenches, and then the substrate is contacted with the photoresist stripping solution that is used in the invention to thereby strip away the first photoresist pattern. Next, another photoresist pattern (second photoresist pattern) is formed on the remaining low-dielectric layer, and using it as a mask, the low-dielectric layer is etched so as to communicate with the trenches, thereby from via holes whose lower part communicates with the Cu layer on the substrate (when a barrier layer is formed on the substrate, then the via holes reach the Cu layer on the substrate via the barrier layer). After this (in case where the substrate has a barrier layer formed thereon, before the barrier layer exposed out of the substrate is etched away or after the barrier has been removed), the substrate is contacted with the photoresist stripping solution that is used in the invention to thereby strip away the second photoresist pattern.

After any of the above-mentioned steps, the via holes and the trenches are filled, for example, electroplated with Cu to form multilayered Cu wiring.

EXAMPLES

The invention is described in more detail with reference to the following Examples, to which, however, the invention should not be limited. Unless otherwise specifically indicated, the amount is in terms of % by mass.

Examples 1 to 6

A substrate having a Cu wiring thereon that is overlaid with an SiOC layer (carbon-doped oxide layer; low-k layer) was used. A positive photoresist, TDUR-P722 (by Tokyo Ohka Kogyo Co., Ltd.) was coated on the substrate, and heated at 140° C. for 90 seconds to form a photoresist layer, and then selectively exposed to light using S-203B (by Nikon Corp.), then further heated at 140° C. for 90 seconds (post-exposure baking treatment), and developed with an aqueous 2.38 mas. % tetraammonium hydroxide (TMAH) solution to form a photoresist pattern. Next, the SiOC layer was etched.

After thusly etched, the substrate was contacted with ozone water for 15 minutes. The ozone water had been prepared by bubbling ozone gas into pure water for 15 minutes. Subsequently, the substrate was dipped (at 60° C. for 30 seconds) in a photoresist stripping solution having the composition as in Table 1 below (stripping solutions A to F).

The surface of the thusly treated substrate was observed with SEM (scanning electronic microscope), and it was found that the photoresist pattern and the etching residues had been completely removed. No corrosion was observed on the low-dielectric layer.

Examples 7 to 12

The substrate that had been etched in the same manner as in Examples 1 to 6 was contacted with aqueous 30 mas. % hydrogen peroxide heated at 60° C., for 30 minutes, and then dipped (at 60° C. for 30 seconds) in a photoresist stripping solution having the composition as in Table 1 below (stripping solutions A to F).

The surface of the thusly treated substrate was observed with SEM (scanning electronic microscope), and it was found that the photoresist pattern and the etching residues had been completely removed. No corrosion was observed on the low-dielectric layer.

Comparative Examples 1 to 6

The substrate that had been etched in the same manner as in Examples 1 to 6 was treated in the same manner as in Examples 1 to 6 except that the step of contacting it with ozone water was omitted.

The surface of the thusly treated substrate was observed with SEM (scanning electronic microscope). It was found that not completely removed, the photoresist pattern and the etching residues had remained on the surface of the substrate.

TABLE 1

| | Components (% by mass) | | | | | |
|---|---|---|---|---|---|---|
| Stripping solution A | TPAH (5) | NMP (31) | Water (40) | DGA (20) | IR42 (2) | 1-thioglycerol (2) |
| Stripping solution B | TBAH (5) | NMP (30) | Water (30) | DGA (32) | IR42 (1) | 1-thioglycerol (2) |
| Stripping solution C | TPAH (5) | NMP (22.5) | Water (40) | DGA (30) | IR42 (1) | 1-thioglycerol (1.5) |
| Stripping solution D | TPAH (5) | NMP (33) | Water (40) | MEA (20) | IR42 (2) | — |
| Stripping solution E | TPAH (15) | NMP (17) | Water (35) | DGA (30) | — | 1-thioglycerol (3) |
| Stripping solution F | TPAH (5) | NMP (32.5) | Water (20) | DGA (40) | IR42 (1) | 1-thioglycerol (1.5) |

The components shown in Table 1 are as follows:
TPAH: tetrapropylammonium hydroxide;
TBAH: tetrabutylammonium hydroxide;
NMP: N-methyl-2-pyrrolidone;
DGA: 2-(2-aminoethoxy)ethanol;
MEA: Monoethanolamine;
IR42: 2,2'-{[(4-methyl-1H-benzotriazol-1-yl)methyl]imino}-bisethanol.

Examples 13 to 18

A substrate having a Cu wiring thereon that is overlaid with an SiN layer (barrier layer) and an SiOC layer (carbon-doped oxide layer; low-k layer) was used. A positive photoresist, TDUR-P722 (by Tokyo Ohka Kogyo Co., Ltd.) was coated on the substrate, and heated at 140° C. for 90 seconds to form a photoresist, layer, and then selectively exposed to light using S-203B (by Nikon Corp.), then further heated at 140° C. for 90 seconds (post-exposure baking treatment), and developed with an aqueous 2.38 mas. % tetraammonium hydroxide (TMAH) solution to form a photoresist pattern. Next, the SiOC layer was etched.

After thusly etched, the substrate was contacted with ozone water for 15 minutes. The ozone water had been prepared by bubbling ozone gas into pure water for 15 minutes. Subsequently, the substrate was dipped (at 60° C. for 30 seconds) in a photoresist stripping solution having the composition as in Table 2 below (stripping solutions G to L).

The surface of the thusly treated substrate was observed with SEM (scanning electronic microscope), and it was found that the photoresist pattern and the etching residues had been completely removed. No corrosion was observed on the low-dielectric layer.

Examples 19 to 24

The substrate that had been etched in the same manner as in Examples 13 to 18 was contacted with aqueous 30 mas. % hydrogen peroxide heated at 60° C., for 30 minutes, and then dipped (at 60° C. for 30 seconds) in a photoresist stripping solution having the composition as in Table 2 below (stripping solutions G to L).

The surface of the thusly treated substrate was observed with SEM (scanning electronic microscope), and it was found that the photoresist pattern and the etching residues had been completely removed. No corrosion was observed on the low-dielectric layer.

Comparative Examples 7 to 12

The substrate that had been etched in the same manner as in Examples 13 to 18 was dipped (at 60° C. for 30 seconds) in a photoresist stripping solution having the composition as in Table 2 below (stripping solutions G to L), but the step of contacting it with ozone water and/or aqueous hydrogen peroxide was omitted.

The surface of the thusly treated substrate was observed with SEM (scanning electronic microscope). It was found that not completely removed, the photoresist pattern and the etching residues remained on the surface of the substrate.

TABLE 2

| | Components (% by mass) | | | |
|---|---|---|---|---|
| Stripping solution G | TMAH (10) | DMSO (50) | water (40) | — |
| Stripping solution H | Choline (10) | DMSO (70) | water (20) | — |
| Stripping solution I | TPAH (15) | DMSO (40) | water (45) | — |
| Stripping solution J | TBAH (5) | DMSO (40) + NMP (30) | water (25) | — |
| Stripping solution K | MTPAH (5) | DMSO (30) + NMP (15) | water (20) | DGA (30) |
| Stripping solution L | MTBAH (10) | DMSO (10) + SLF (5) | water (40) | DGA (35) |

The components shown in Table 2 are as follows:
TMAH: tetramethylammonium hydroxide;
Choline: (2-hydroxyethyl)trimethylammonium hydroxide (=choline);
TPAH: tetrapropylammonium hydroxide;
TBAH: tetrabutylammonium hydroxide;
MTPAH: methyltripropylammonium hydroxide;
MTBAH: methyltributylammonium hydroxide;
DMSO: dimethylsulfoxide;
NMP: N-methyl-2-pyrrolidone;
SLF: sulforane;
DGA: 2-(2-aminoethoxy)ethanol.

The components shown in Table 2 are as follows:

| | |
|---|---|
| TMAH: | tetramethylammonium hydroxide; |
| Choline: | (2-hydroxyethyl)trimethylammonium hydroxide (=choline); |
| TPAH: | tetrapropylammonium hydroxide; |
| TBAH: | tetrabutylammonium hydroxide; |
| MTPAH: | methyltripropylammonium hydroxide; |
| MTBAH: | methyltributylammonium hydroxide; |
| DMSO: | dimethylsulfoxide; |
| NMP: | N-methyl-2-pyrrolidone; |
| SLF: | sulforane; |
| DGA: | 2-(2-aminoethoxy)ethanol. |

As described in detail hereinabove, the present invention ensures advantageous effects in stripping photoresist films and etching residues even in a process that does not include $O_2$ plasma ashing treatment in micropatterning of a substrate having at least Cu wiring and a low-dielectric layer thereon, and, in addition, the method for stripping a photoresist of the invention does not have any negative influence on the dielectric constant of the low-dielectric layer and does not corrode the low-dielectric layer.

INDUSTRIAL APPLICABILITY

As described hereinabove, the photoresist-stripping method of the invention is suitable to a dual damascene process of micropatterning a substrate that has at least Cu wiring and a low-dielectric layer thereon. In particular, it is favorable for stripping photoresists in a process not including a conventional $O_2$ plasma ashing step for the production of semiconductor devices such as ICs, LSIs, etc.

The invention claimed is:

1. A method for stripping a photoresist that comprises:
   (I) selectively etching a low-dielectric layer provided on a substrate, where the substrate has at least a copper (Cu) wiring and the low-dielectric layer thereon, by using a photoresist pattern as a mask which is formed on the substrate;
   (II) contacting the substrate after the step (I), with aqueous hydrogen peroxide; and
   (III) contacting the substrate after the step (II), with a photoresist stripping solution that consists of
      (i) from 2 to 10% by mass of a quaternary ammonium hydroxide represented by the following formula (I):

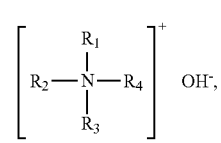

(I)

wherein $R_1$, $R_2$, $R_3$ and $R_4$ each independently represent an alkyl group having from 1 to 4 carbon atoms,
      (ii) from 5 to 60% by mass of water,
      (iii) a water-soluble organic solvent,
      (iv) a water-soluble amine as an optional component,
      (v) a corrosion inhibitor as an optional component, and
      (vi) an acetylene alcohol/alkylene oxide adduct as an optional component.

2. The method for stripping a photoresist as claimed in claim 1, wherein the low-dielectric layer has a dielectric constant of 3 or less.

3. The method for stripping a photoresist as claimed in claim 1, wherein the water-soluble organic solvent is at least one selected from the group consisting of dimethylsulfoxide, dimethylimidazolidinone, N-methyl-2-pyrrolidone, diethylene glycol monobutyl ether, sulforane, N,N-dimethylacetamide, and N,N-dimethylformamide.

4. The method for stripping a photoresist as claimed in claim 1, wherein the photoresist stripping solution contains the water-soluble amine.

5. The method for stripping a photoresist as claimed in claim 1, wherein the photoresist stripping solution contains the corrosion inhibitor, and the corrosion inhibitor is at least one compound selected from the group consisting of an aromatic hydroxy compound, a benzotriazole-based compound, and a mercapto group containing compound.

* * * * *